United States Patent
Kochar et al.

(10) Patent No.: US 8,693,259 B2
(45) Date of Patent: Apr. 8, 2014

(54) WORDLINE-TO-WORDLINE STRESS CONFIGURATION

(75) Inventors: Mrinal Kochar, San Jose, CA (US); Jianmin Huang, Sunnyvale, CA (US); Jun Wan, San Jose, CA (US); Jian Chen, Menlo Park, CA (US)

(73) Assignee: SanDisk Technologies Inc., Plano, TX (US)

( * ) Notice: Subject to any disclaimer, the term of this patent is extended or adjusted under 35 U.S.C. 154(b) by 130 days.

(21) Appl. No.: 13/340,437

(22) Filed: Dec. 29, 2011

(65) Prior Publication Data
US 2013/0170301 A1 Jul. 4, 2013

(51) Int. Cl.
*G11C 16/06* (2006.01)

(52) U.S. Cl.
USPC .............. 365/185.22; 365/185.09; 365/185.24

(58) Field of Classification Search
USPC ............... 365/185.18, 185.2, 185.22, 185.24, 365/185.09, 185.29, 201
See application file for complete search history.

(56) References Cited

U.S. PATENT DOCUMENTS

| | | | |
|---|---|---|---|
| 5,627,787 A * | 5/1997 | McClure | 365/201 |
| 5,818,764 A | 10/1998 | Yiu et al. | |
| 6,643,804 B1 * | 11/2003 | Aipperspach et al. | 714/718 |
| 7,031,902 B1 * | 4/2006 | Catiller | 703/24 |
| 7,260,758 B1 * | 8/2007 | Agrawal et al. | 714/733 |
| 7,315,915 B2 | 1/2008 | Fukuda et al. | |
| 7,493,541 B1 * | 2/2009 | Agrawal et al. | 714/733 |
| 2010/0277983 A1 | 11/2010 | Mokhlesi et al. | |

* cited by examiner

*Primary Examiner* — Gene Auduong
(74) *Attorney, Agent, or Firm* — Brinks Gilson & Lione

(57) ABSTRACT

A method and system for performing wordline-to-wordline stress routines on a storage device is disclosed. Stress routines may be performed to reduce state widening in multi-level memory cells in the storage device. However, data retention problems may result if the stress routines are performed too often. In order to perform the stress routines at the proper times, a stress control variable is used. The stress control variable may be indicative of age of the storage device (such as the number of erase cycles performed on a memory block in the storage device). The stress control variable is input to a look-up table (or other logical construct), with the output of the look-up table indicating whether to perform the wordline-to-wordline stress routine. In this way, the stress routines may be performed to reduce state widening while reducing the ill effects of data retention.

22 Claims, 8 Drawing Sheets

WORDLINE-TO-WORDLINE STRESS CONFIGURATION

TECHNICAL FIELD

This application relates generally to stress routines in a memory system. More specifically, this application relates to a wordline-to-wordline stress routine in the memory system.

BACKGROUND

Non-volatile memory systems, such as flash memory, have been widely adopted for use in host devices, such as consumer products. Flash memory may be found in different forms, such as in the form of a portable memory card that can be carried between host devices or as a solid state disk (SSD) embedded in a host device.

The flash memory may be composed of memory cells. The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory.

For example, an MLC memory cell can include four possible states per cell, thereby storing two bits of information per cell. In this way, there are multiple states per cell, with bit values corresponding to each of the states, such as "00", "01", "10", and "11". The MLC memory cell may experience state widening, resulting in potential errors. For example, the "A" state (bit value "00") may experience state widening, resulting in an increased error rate for the MLC cells.

One solution to combat state widening is conducting high voltage stress of the wordlines. In particular, wordline-to-wordline stress routines may be implemented in which the wordlines are stressed with high voltage during an erase cycle. However, the wordline stress routines, while solving one problem, may create another. High voltage stress may cause data retention problems in which charge leaks out of the memory cell. Accordingly, a need exists to combat state widening while avoiding data retention problems.

BRIEF SUMMARY

A method and system are disclosed for performing wordline-to-wordline stress routines on a storage device.

According to a first aspect, a method for determining whether to perform a stress routine in a storage device is disclosed. The method comprises: accessing a stress control variable, the stress control variable indicative of at least one dynamic aspect of the storage device; determining whether to perform the stress routine, wherein determining whether to perform the stress routine is varied based on the stress control variable; and if it is determined to perform the stress routine, performing the stress routine.

In one embodiment, the stress control variable varies during at least a part of operation of the storage device, such as indicative of age of the storage device. For example, the stress control variable may be indicative of a number of erase cycles that have been performed on one, some, or all of the memory blocks in the storage device. In another embodiment, the stress control variable may be indicative of leakage current between different wordlines.

The determination whether to perform the stress routine may vary based on the stress control variable. For example, the determination whether to perform the stress routine may be different at stage of operation of the storage device than at another stage of operation of the storage device (such as at one age of the storage device than at another age of the storage device). More particularly, the frequency of performing the stress routine when the storage device is considered "fresh" (or has undergone less than a predetermined number of erase cycles) is less than the storage device is not considered "fresh". The determination whether to perform the stress routine may be based on inputting the stress control variable to a look-up table (or other logical construct), with the output of the look-up table indicating whether to perform the wordline-to-wordline stress routine. In this way, the stress routines may be performed to reduce state widening while reducing the ill effects of data retention.

According to a second aspect, a storage device is disclosed. The storage device includes a memory and a controller in communication with the memory. The controller of the storage device is configured to: access a stress control variable, the stress control variable indicative of at least one dynamic aspect of the storage device; determine whether to perform the stress routine, wherein determining whether to perform the stress routine is varied based on the stress control variable; and if it is determined to perform the stress routine, perform the stress routine.

Embodiments of the present invention are defined by the claims, and nothing in this section should be taken as a limitation on those claims. Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

Figure 1:
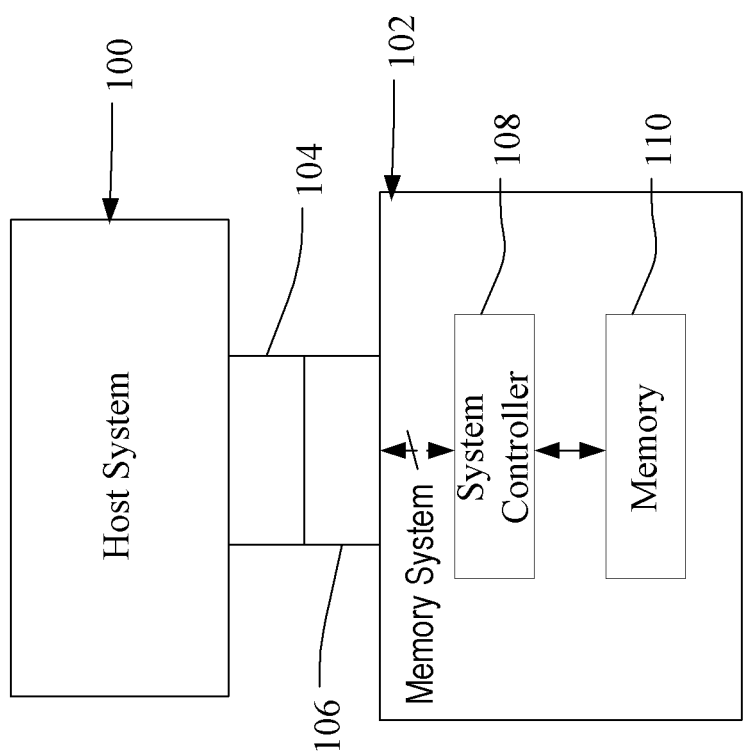
FIG. 1 illustrates a host connected with a memory system having non-volatile memory.

A flash memory system suitable for use in implementing aspects of the invention is shown in FIGS. 1-4. A host system 100 of FIG. 1 stores data into and retrieves data from a memory system 102. The memory system 102 is an example of a storage device and may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host 100. SSD drives may be in the form of discrete modules that are drop-in replacements for rotating magnetic disk drives.

One example of a commercially available SSD drive is a 32 gigabyte SSD produced by SanDisk Corporation. Examples of commercially available removable flash memory cards include the CompactFlash (CF), the MultiMediaCard (MMC), Secure Digital (SD), miniSD, Memory Stick, and TransFlash cards. Although each of these cards has a unique mechanical and/or electrical interface according to its standardized specifications, the flash memory system included in each is similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, cellular telephones, personal digital assistants (PDAs), digital still cameras, digital movie cameras and portable audio players. For portable memory card applications, a host may include a built-in receptacle for one or more types of memory cards or flash drives, or a host may require adapters into which a memory card is plugged. The memory system usually contains its own memory controller and drivers but there are also some memory-only systems that are instead controlled by software executed by the host to which the memory is connected. In some memory systems containing the controller, especially those embedded within a host, the memory, controller and drivers are often formed on a single integrated circuit chip.

The host system 100 of FIG. 1 may be viewed as having two major parts, insofar as the memory system 102 is concerned, including the system controller 108 and the memory 110. As discussed in more detail below, memory 110 may include non-volatile memory. In one embodiment, the non-volatile memory may include multi-bank flash memory, discussed in more detail below. In an alternative embodiment, the non-volatile memory may include a single bank flash memory.

The system controller 108 interfaces with the host system 100 to which the memory system 102 is connected for passing data back and forth, and controls the memory 110. The system controller 108 may convert between logical addresses of data used by the host 100 and physical addresses of the memory 110 during data programming and reading. Functionally, the system controller 108 may include a front end that interfaces with the host system 100, controller logic for coordinating operation of the memory 110, flash management logic for internal memory management operations such as system initiation, writing data within a block, bad block management and handling block linkage information, as well as one or more flash interface modules (FIMs) to provide a communication interface between the system controller 108 with the flash memory.

Figure 2:
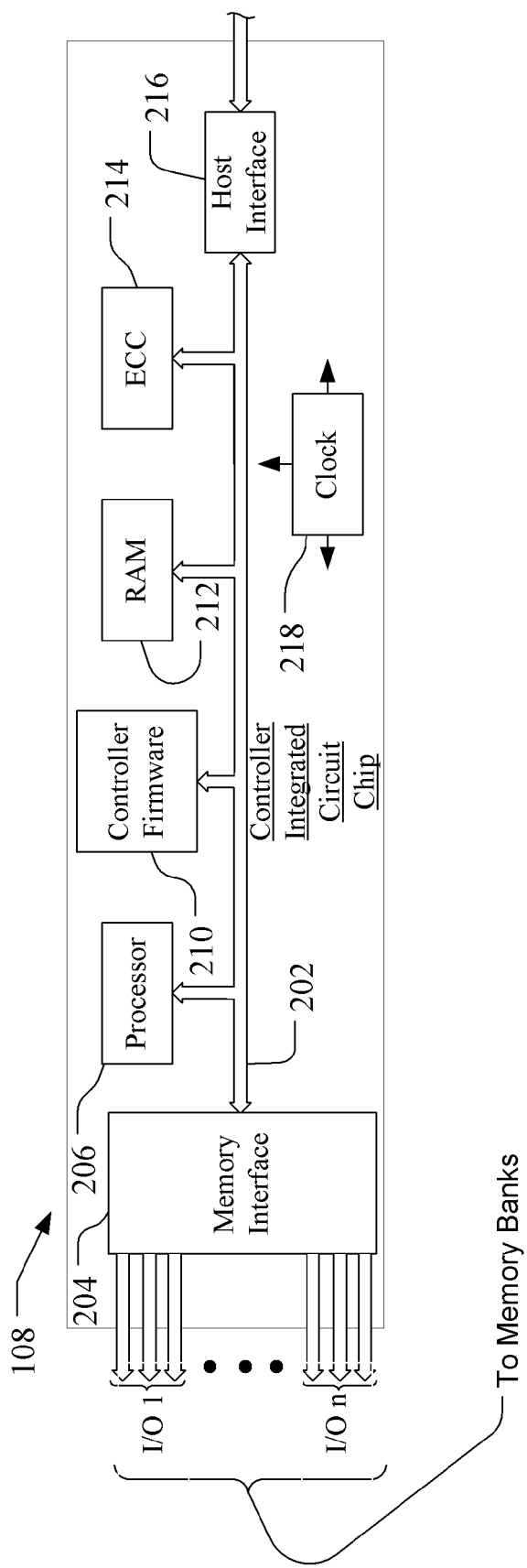
FIG. 2 is an example block diagram of a flash memory system controller for use in the non-volatile memory of FIG. 1.
Figure 5:
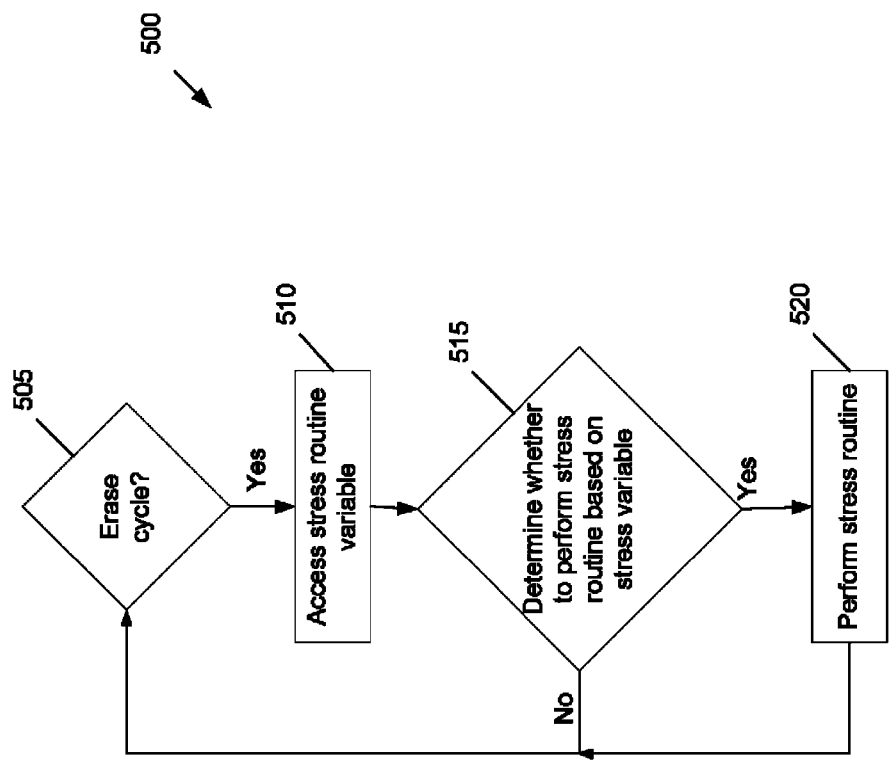
FIG. 5 is a flow diagram illustrating one embodiment of operation of the stress routine.

The system controller 108 may comprise a microcontroller, a processor, or any other type of device for implementing the functionality and logic described herein (such as the logic described in FIG. 5). The system controller 108 may be implemented on a single integrated circuit chip, such as an application specific integrated circuit (ASIC) or a programmable logic array, such as illustrated in FIG. 2. The processor 206 of the system controller 108 may be configured as a multi-thread processor capable of communicating separately with each of the respective memory banks via a memory interface 204 having I/O ports for each of the respective banks in the multi-bank flash memory. The system controller 108 may include an internal clock 218. The processor 206 communicates with an error correction code (ECC) module 214, a RAM buffer 212, a host interface 216, and controller firmware 210 via an internal data bus 202. Controller firmware 210 may include one or more programs to operate the system controller 108 of memory system 102. For example, the functionality of FIG. 5 may be achieved through executing one or more of the programs in controller firmware 210. The program in the present context means any expression, in any language, code or notation, of a set of instructions intended to cause a system having an information processing capability to perform a particular function, either directly or after either or both of the following; a) conversion to another language, code or notation; b) reproduction in a different material form.

Figure 3:
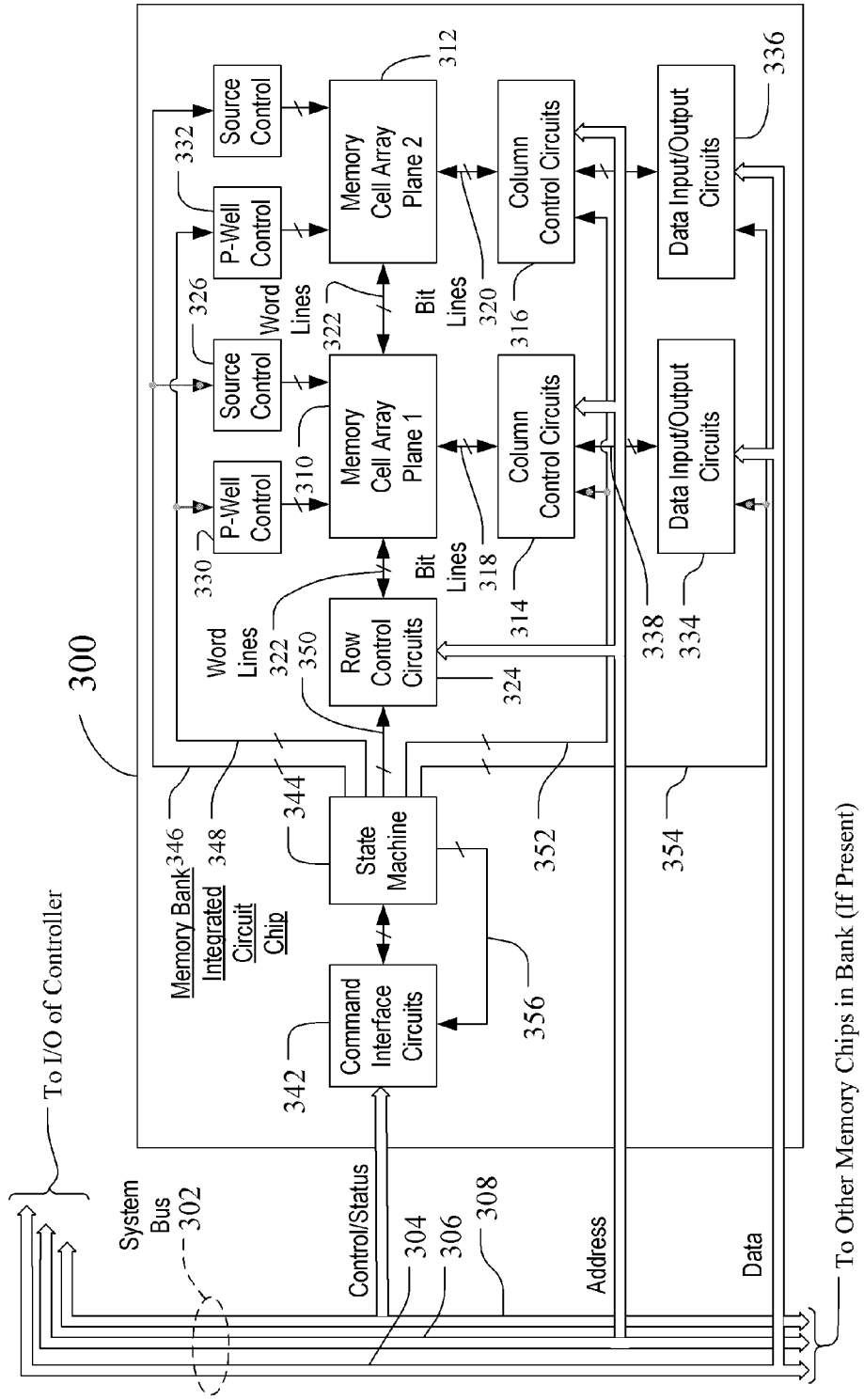
FIG. 3 is an example one flash memory bank suitable as one of the flash memory banks illustrated in FIG. 1.

Each bank in the multi-bank flash memory may comprise one or more integrated circuit chips, where each chip may contain an array of memory cells organized into multiple planes. An illustration of a memory bank 300 on a single chip is shown in FIG. 3. The memory bank 300 of FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The wordlines 322 are addressed through row control circuits 324 in response to addresses received on the address bus. Source voltage control circuits 326 and 328 are also connected with the respective planes, as are p-well voltage control circuits 330 and 332. If the bank 300 is in the form of a memory chip with a single array of memory cells, and if two or more such chips exist in the system, the array of each chip may be operated similarly to a plane within the multi-plane chip described above.

Data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Each memory chip in each bank contains some controlling circuitry that executes commands from the controller 108 to perform such functions. Interface circuits 342 are connected to the control and status portion 308 of the system bus 302. Commands from the controller 108 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 108 over the bus portion 308.

A NAND architecture of the memory cell arrays 310 and 312 is discussed below, although other non-volatile memory architectures or technologies, alone or combination, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
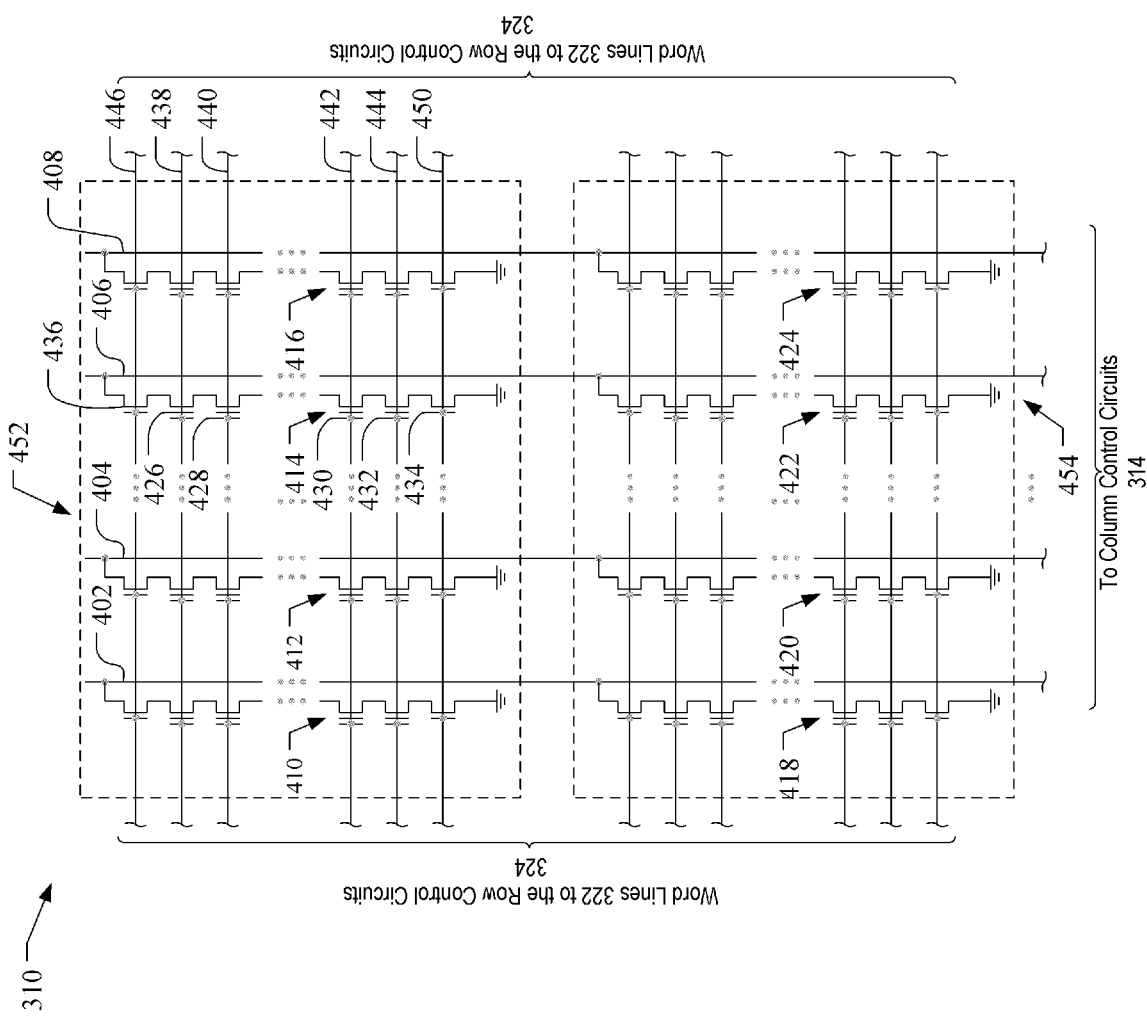
FIG. 4 is a representative circuit diagram of a memory cell array that may be used in the memory bank of FIG. 3.

Wordlines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the wordlines 438-444, are programmed at a time. Typically, the rows of a NAND array are programmed in a prescribed order, in this case beginning with the row along the wordline 444 closest to the end of the strings connected to ground or another common potential. The row of memory cells along the wordline 442 is programmed next, and so on, throughout the block 452. The row along the wordline 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 424. If there is more than one plane in the system, such as planes 1 and 2 of FIG. 3, one memory architecture uses common wordlines extending between them. There can alternatively be more than two planes that share common wordlines. In other memory architectures, the wordlines of individual planes are separately driven.

As discussed above, the memory cells may be operated to store more than two detectable levels of charge in each charge storage element or region, thereby to store more than one bit of data in each. This latter configuration is referred to as multi-level cell (MLC) memory. The charge storage elements of the memory cells are most commonly conductive floating gates but may alternatively be non-conductive dielectric charge trapping material. The MLC memory cell may store 2-bits of data, 3-bits of data, or more.

The different values of the MLC memory cell correspond to a different states. For example, a 2-bit memory cell includes values or states of "00", "01", "10", and "11". Each of the values or states corresponds to a particular voltage range. However, the voltage range for a particular state may widen, thereby causing overlap into another state and result in errors. To reduce state widening, the storage device may undergo a wordline-to-wordline stress routine. However, the wordline-to-wordline stress routine may cause data retention problems. In this way, the system controller 108 may determine when to perform the wordline-to-wordline stress routine in order to reduce state widening and also account for potential data retention issues.

One option is to perform the wordline-to-wordline stress routine at a constant or predetermined frequency throughout the life of the memory system 102. An example of a constant or predetermined frequency is to perform the wordline-to-wordline stress routine every "X" erase cycles (such as every 10 erase cycles). As discussed above, the memory system 102 may be divided in various ways, such as divided into blocks. The block is erased prior to data being written (or rewritten) with new data. Erasing a block may involve setting all of the bits in the block to a predetermined state (such as "1").

While the first option reduces state widening, the constant frequency may cause excessive data retention loss. As the memory system 102 ages (e.g., as the memory system 102 undergoes erase cycles), the cells in the memory system 102 may be more susceptible to data retention loss issues. This susceptibility is especially pronounced as the memory system 102 approaches the upper limit of the rating for the total number of erase cycles. Typically, flash memory has a finite number of erase cycles before the wear begins to deteriorate the integrity of the memory cells. For example, if a storage device is rated for 100 erase cycles, data retention issues will increase as the number of erase cycles approaches 100. In this way, a constant frequency of performing the stress routines may cause more data retention problems as the number of erase cycles increases.

Another option is to have a non-constant or a variable frequency when to perform the wordline-to-wordline stress routine. In this option, the determination is dynamic and may be based on one or more aspects of the storage device. The wordline-to-wordline stress routine may be more frequently performed during one period of operation than during another period of operation of the storage device. For example, data retention errors may be more prevalent as the storage device ages (such as toward the end of the rated life of the storage device). So that, the wordline-to-wordline stress routine may be performed less often as the storage device ages or is close to or at the end of the rated life of the storage device than at other periods of operation of the storage device (such as during testing, after testing and at the beginning or in the middle of the rated life of the storage device).

In this way, one aspect for making the determination is the age, wear or reliability of the device. For example, the determination whether to perform the wordline-to-wordline stress routine may be dependent, at least in part, on an indication of the age, wear or reliability of the storage device. So that, the closer the storage device is to the total number of erase cycles that is rated for the storage device, the less likely the wordline-to-wordline stress routine is performed. For example, the determination whether to perform the wordline-to-wordline stress routine may be based on an indication of the total number of erase cycles, such as a counter indicating the total number of erase cycles.

Another aspect for making the determination is an indication of leakage between different wordlines. Circuitry may be used to detect an amount of leakage current between different wordlines. The amount of leakage current detected may be used to make the determination whether to perform the wordline-to-wordline stress routine, as discussed in more detail below.

Referring to FIG. 5, there is shown a flow chart 500 for determining whether to perform a wordline-to-wordline stress routine. The flow chart 500 may comprise instructions stored in controller firmware 210 and executed by processor 206. At 505, it is determined whether an erase cycle needs to be performed. As discussed above, erase cycles are performed on a block of memory prior to writing (or rewriting) data to the block. In one embodiment, the stress routine may be performed concurrently or during the erase cycle. In this way, the determination whether to perform the wordline-to-wordline stress routine may be triggered when it is determined whether to perform an erase operation. In an alternative embodiment, the wordline-to-wordline stress routine may be performed in an operation separate from the erase operation. So that, the determination whether to perform the wordline-to-wordline stress routine need not be triggered when it is determined whether to perform an erase operation.

As shown in FIG. 5, if it is determined to perform an erase cycle, the flow chart proceeds to 510 to access a stress routine variable. In one embodiment, the stress routine variable may be indicative of age, wear or reliability of the storage device. For example, the stress routine variable may comprise the total number of erases for one, some, or all of the blocks in the storage device. Alternatively (or in addition), the stress routine variable may be an indication of leakage current between wordlines.

Each of the different blocks undergoes an erase cycle when data to the block is written (or rewritten). Due to wear-leveling, the data written to each of the blocks will be evenly distributed across the different blocks in the storage device. Wear leveling arranges data so that erasures and re-writes are distributed evenly across the flash storage device. In this way, no single erase block prematurely fails due to a high concentration of write cycles. Correspondingly, the number of erase cycles should be the same or similar for each of the different blocks. In this way, the stress routine variable may be based on the number of erase cycles performed for a single block, on an average of the erase cycles performed for multiple blocks, or on an average of the erase cycles performed for all of the blocks.

At 515, it is determined whether to perform the wordline-to-wordline stress routine based solely (or in part) on the stress routine variable. If it is determined to perform the wordline-to-wordline stress routine, the wordline-to-wordline stress routine is performed at 520.

The stress routine variable may comprise an input to a look-up table, with the output of the look-up table being an indication whether to perform the wordline-to-wordline stress routine. For example, the stress control variable may comprise the number of erase cycles that have been performed in one, some, or all of the blocks in the storage device. In this example, the look-up table may correlate different numbers of erase cycles with different determinations whether to perform the stress routine. The look-up table may have different frequencies of performing the stress routine for different erase cycle ranges.

For example, a storage device may be more or less susceptible to state widening at different stages or states of the life of the storage device. When the storage device is fresh (e.g., when the storage device has undergone no or very few erase cycles and is in its initial period of life), the effect of state widening is less prevalent. As the storage device ages, the effect of state widening increases. Similarly, the storage device may be more or less susceptible to data retention issues at different stages of the life of the storage device.

In this way, when the storage device is fresh, the effect of damage to data retention by performing the stress routine may be greater than the benefit to reducing the effect of state widening. Therefore, after a fresh download, the memory blocks are stressed less often (such as once every 10 erase cycles (through file 21) until a predetermined age of the storage device (such as when the erase count reaches a predetermined number (such as 100)). After the storage device reaches the predetermined age (such as when the erase count reaches the predetermined number), the frequency of stressing the memory blocks is increased. So that, lower numbers of erase cycles tend to have a lower frequency of performing stress routine, whereas higher numbers of erase cycles tend to have a higher frequency of performing stress routine.

Thus, the values output by the look-up table may factor in the age, wear or reliability of the storage device when determining whether to perform the stress routine. The values output by the look-up table may further balance the benefit to performing the stress routine in reducing state widening with the potential damaging effect to data retention. Use of a look-up table is merely one type of logical construct to correlate the stress control variable with a determination whether to perform the stress routine. Other logical constructs, such as equations, are contemplated.

As another example, the stress control variable may comprise the amount of leakage current between different wordlines. In this example, the stress control variable may be input to a look-up table, which correlates the amount of leakage current to a determination whether to perform the stress routine. Higher amounts of leakage current tend to result in a determination to perform the stress routine, whereas lower amounts of leakage current tend to result in a determination not to perform the stress routine.

Though FIG. 5 indicates use of a single stress control variable, multiple stress control variables may be used. For example, stress control variables indicative of age, wear or reliability of the storage device and indicative of an amount of leakage current between the wordlines may be used. In this example, the look-up table may input values for both stress control variables and, based on the values for both stress control variables, output the determination whether to perform the stress routine. The values output by the look-up table may factor in the age or wear of the storage device and the amount of leakage current when determining whether to perform the stress routine.

Figure 6A:
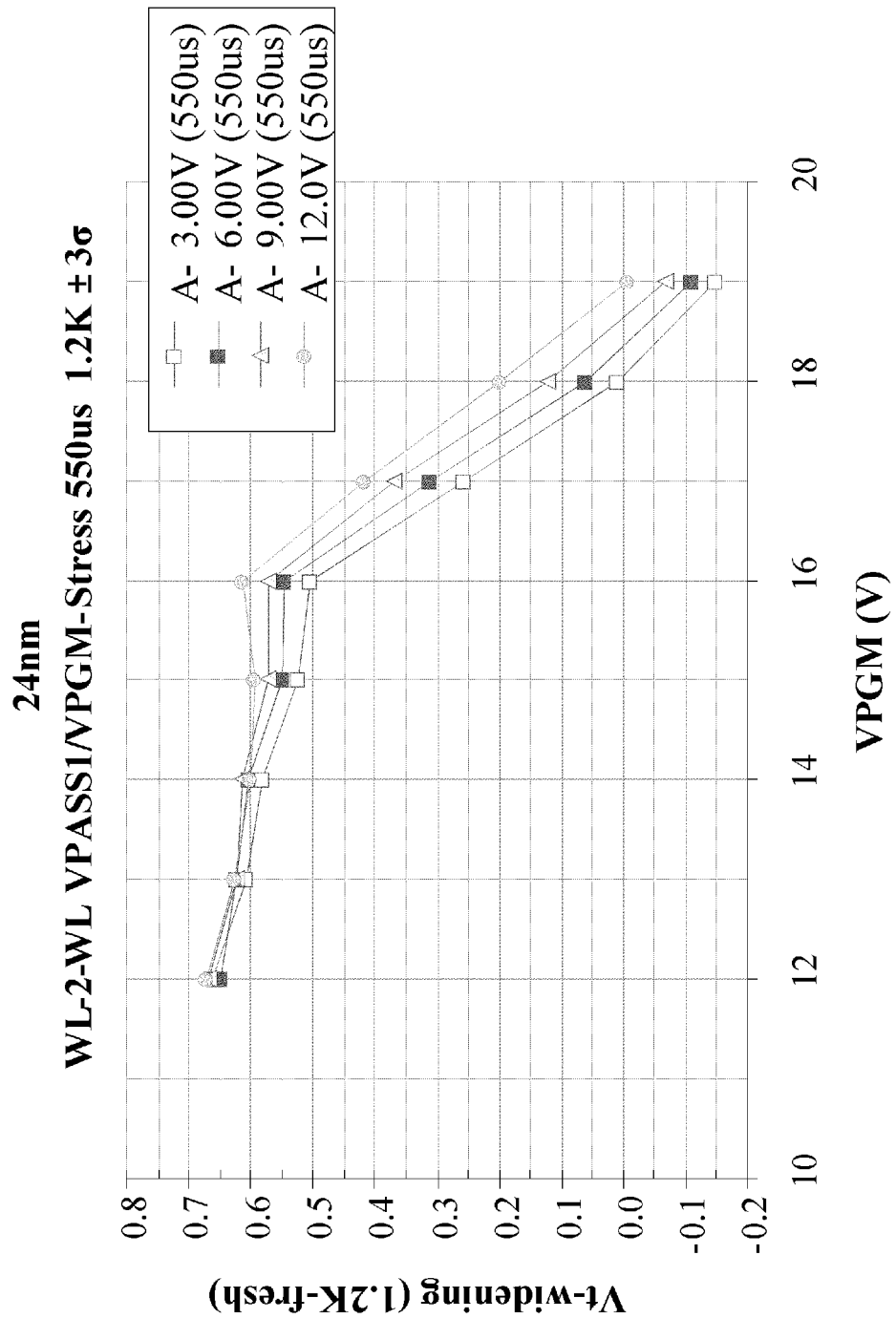
FIG. 6A is a graph of the stress programming voltage (VPGM) versus voltage threshold (Vt).

FIG. 6A is a graph of the stress programming voltage (VPGM) versus voltage threshold (Vt), which is indicative of state widening. FIG. 6A is for a 24 nM feature length of the storage device, indicating that the wordlines and bitlines of the storage device 24 nM. 24 nM is merely an example of the feature length. Other feature lengths are contemplated. FIG. 6A illustrates that Vt widening at different stress voltages with pulse-duration of 550 μs compared with fresh storage device (i.e., the storage device has not undergone erase cycling). With erase cycling, the state widening may worsen. FIG. 6A further illustrates that Vt widening becomes negative with certain condition. To maintain the thresholds of the memory cell, the stress routine may seek to have 0 threshold widening, see for example, 3V/18V.

Figure 6B:
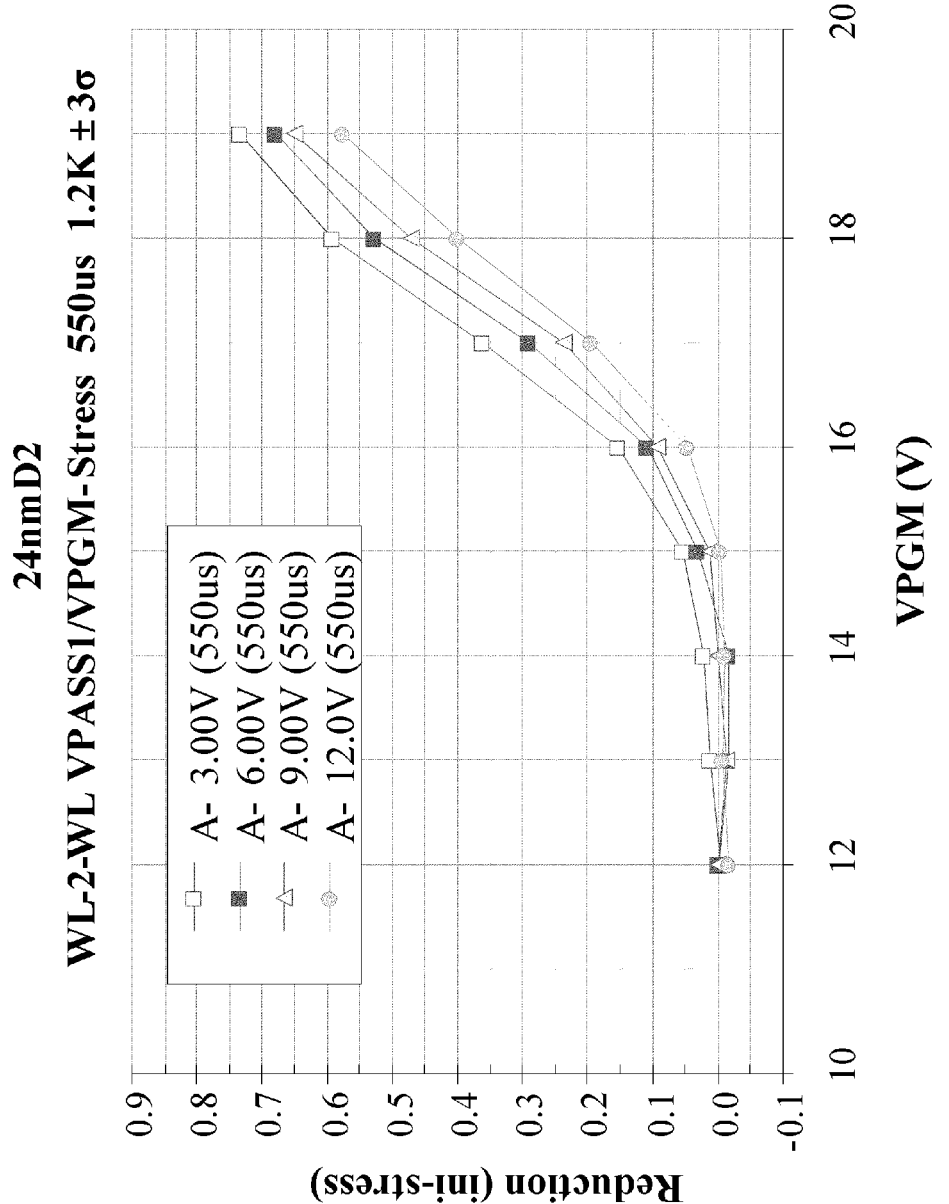
FIG. 6B is a graph of the stress programming voltage (VPGM) versus reduction in initial stress (ini-stress).

FIG. 6B is a graph of the stress programming voltage (VPGM) versus reduction in initial stress (ini-stress). FIG. 6B illustrates that the Vt width reduction at different stress voltages (stress) with pulse-duration of 550 us compared with 1.2K cycle without stress (ini). So that, the reduction is defined as Vt-width(ini)−Vt-width (after stress).

Figure 7:
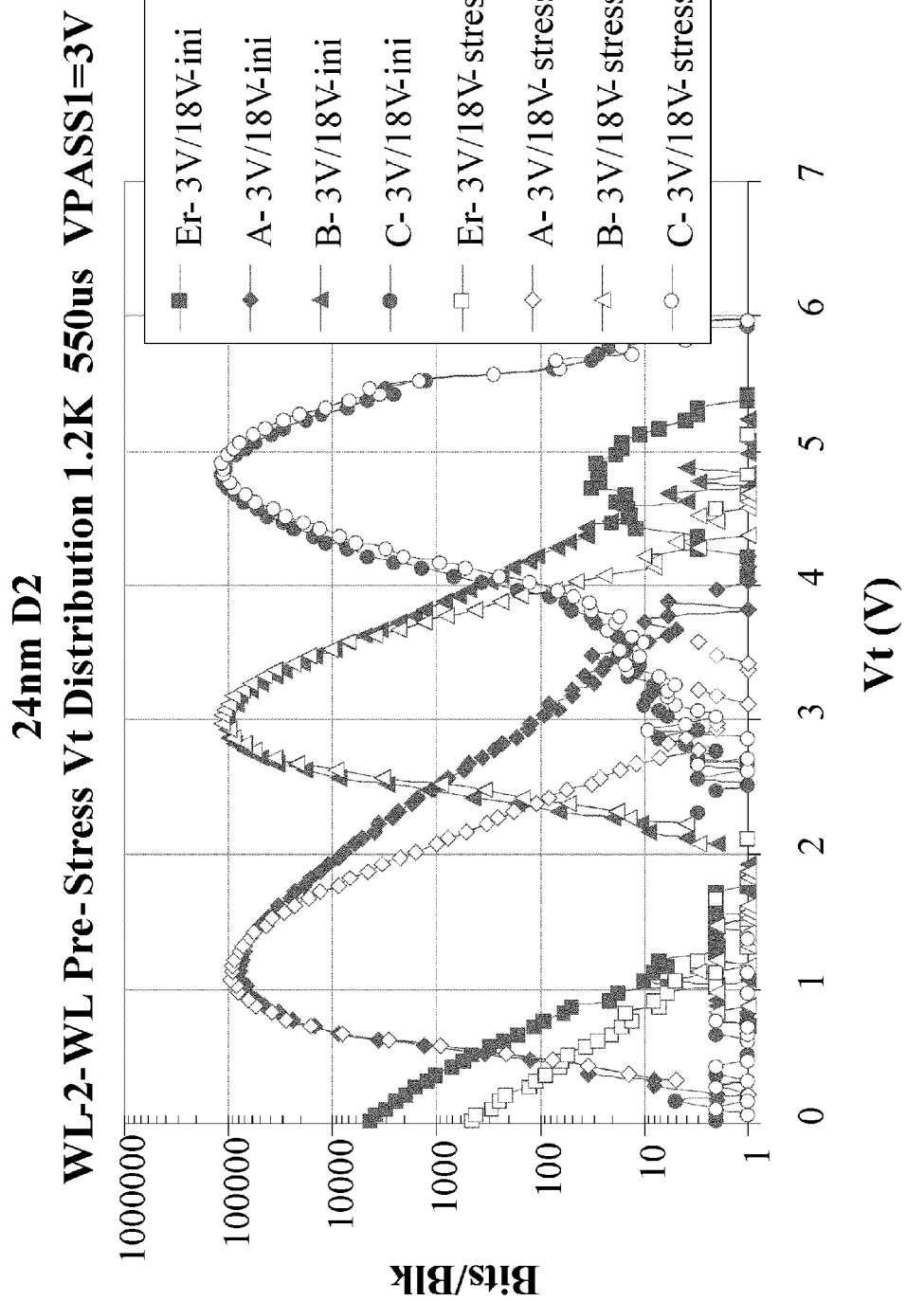
FIG. 7 is a graph of threshold voltage (Vt) versus Bits/Block.

FIG. 7 is a graph of threshold voltage (Vt) versus Bits/Block. Based on the data illustrated in FIGS. 6A-B, it appears that a 550 us pulse width may be acceptable. FIG. 7 illustrates the real distribution data using 3V/18V with 550 us as an example. The 18V stress is applied on the 1.2K cycled block with pulse-duration of 550 us (measured). Here, the block has been cycled 1.2K without any stress. It does not appear that there is worse C lower tail after stress. The lighter lines correspond to the distribution of data after 1.2K write/erase cycles, whereas the darker lines correspond to the data distribution after applying stress routines. As shown in FIG. 7, it appears that the memory cells stressing at 18V for 550 μs is acceptable.

Use of the stress control variable as described in FIG. 5 may benefit the operation of the device in one of several ways. First, using the stress control variable may lower test time of the storage device. Instead of having to perform the stress routine during testing of the device, the stress routine may be performed during product operation (or after the testing period of the device). Thus, testing of the device may take less time. Second, using the stress control variable may lower the number of defective storage devices (e.g., lower defective parts per million (DPPM)). Third, performing the stress control routine as illustrated in FIG. 5 has a low impact on the performance of the storage device since the stress control routine may be performed during the erase cycle. Finally, performing the stress control routine as illustrated in FIG. 5 has little or no loss of user data in the storage device.

Accordingly, the method and system may be realized in hardware, software, or a combination of hardware and software. The method and system may be realized in a centralized fashion in at least one electronic device (such as illustrated in flash memory device 102 in FIG. 1) or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

We claim:

1. A method for determining whether to perform a stress routine in a storage device, the method comprising:
   accessing a stress control variable, the stress control variable indicative of use or reliability of at least a part of the storage device;
   determining whether to perform the stress routine, wherein determining whether to perform the stress routine is varied based on the stress control variable; and
   if it is determined to perform the stress routine, performing the stress routine.

2. The method of claim 1, wherein a frequency of performing the stress routine when the stress control variable indicates less use of the storage device is lower than a frequency of performing the stress routine when the stress control variable indicates greater use of the storage device.

3. The method of claim 1, wherein the stress routine comprises a wordline-to-wordline stress routine.

4. The method of claim 3, wherein the stress control variable is indicative of a leakage current from wordline-to-wordline.

5. The method of claim 1, wherein determining whether to perform the stress routine is based on a logical construct correlating the stress control variable with the determination whether to perform the stress routine.

6. The method of claim 1, wherein the stress control variable is indicative of a number of erase cycles performed on one or more blocks during at least a part of operation of the storage device.

7. The method of claim 6, wherein determining whether to perform the stress routine comprises:
   determining to perform the stress routine every "X" erase cycles, where "X" is an integer.

8. The method of claim 6, wherein the closer the number of erase cycles is to a rated number of erase cycles for the storage device, the less likely the stress routine is performed.

9. The method of claim 1, wherein the stress control variable is indicative of an amount of leakage current between different wordlines.

10. The method of claim 9, wherein the stress control variable indicating a higher amount of leakage current results in the stress routine being more likely performed than the stress control variable indicating a lower amount of leakage current.

11. A method for determining whether to perform a stress routine in a storage device, the method comprising:
   accessing a stress control variable, the stress control variable indicative of at least one dynamic aspect of the storage device;
   determining whether to perform the stress routine, wherein determining whether to perform the stress routine is varied based on the stress control variable; and
   if it is determined to perform the stress routine, performing the stress routine,
   wherein the stress control variable is indicative of a number of erase cycles performed on at least one block in the storage device.

12. A storage device comprising:
   a memory; and
   a controller in communication with the memory, the controller configured to:
   access a stress control variable, the stress control variable indicative of use or reliability of at least a part of the storage device;
   determine whether to perform the stress routine, wherein determining whether to perform the stress routine is varied based on the stress control variable; and
   if it is determined to perform the stress routine, perform the stress routine.

13. The storage device of claim 12, wherein the controller is configured to determine whether to perform the stress routine when the stress control variable indicates less use of the storage device at a lower frequency than determining whether to perform the stress routine when the stress control variable indicates greater use of the storage device.

14. The storage device of claim 12, wherein the stress control variable is indicative of a number of erase cycles performed on at least one block in the storage device.

15. The storage device of claim 12, wherein the stress routine comprises a wordline-to-wordline stress routine.

16. The storage device of claim 15, wherein the stress control variable is indicative of a leakage current from wordline-to-wordline.

17. The storage device of claim 12, wherein the controller is configured to determine whether to perform the stress routine based on a logical construct correlating the stress control variable with the determination whether to perform the stress routine.

18. The storage device of claim 12, wherein the stress control variable is indicative of a number of erase cycles performed on one or more blocks during at least a part of operation of the storage device.

19. The storage device of claim 18, wherein the controller is configured to determine whether to perform the stress routine by:

determining to perform the stress routine every "X" erase cycles, where "X" is an integer.

20. The storage device of claim 18, wherein the closer the number of erase cycles is to a rated number of erase cycles for the storage device, the controller is less likely to perform the stress routine.

21. The storage device of claim 12, wherein the stress control variable is indicative of an amount of leakage current between different wordlines.

22. The storage device of claim 21, wherein the stress control variable indicating a higher amount of leakage current results in controller being more likely to perform the stress routine than the stress control variable indicating a lower amount of leakage current.

* * * * *